United States Patent [19]

Klein et al.

[11] Patent Number: 4,902,605
[45] Date of Patent: Feb. 20, 1990

[54] PHOTORESIST COMPOSITION COMPRISING CYCLOHEXYLENEOXYALKYL ACRYLATES

[75] Inventors: Gerald W. Klein, Pittsford; Robert C. McConkey, Rochester; Michel F. Molaire, Rochester; John M. Noonan, Rochester, all of N.Y.

[73] Assignee: Eastman Kodak Company, Rochester, N.Y.

[21] Appl. No.: 77,715

[22] Filed: Jul. 24, 1987

[51] Int. Cl.$^4$ .................................................. G03C 1/68
[52] U.S. Cl. ...................... 430/285; 430/288; 430/281; 522/121; 522/142; 522/144
[58] Field of Search ........................ 430/288, 281, 285; 522/121, 142, 144

[56] References Cited

U.S. PATENT DOCUMENTS

| | | | |
|---|---|---|---|
| 2,927,023 | 3/1960 | Martin | 430/281 |
| 3,756,827 | 9/1973 | Chang | 430/281 X |
| 3,832,176 | 8/1974 | Verstraete et al. | 96/67 |
| 4,304,838 | 12/1981 | Hasegawa et al. | 430/253 |
| 4,322,490 | 3/1982 | Molaire | 430/281 |
| 4,533,445 | 8/1985 | Orio | 430/285 X |
| 4,567,128 | 1/1986 | Bennett | |
| 4,619,890 | 10/1986 | Molaire et al. | 430/495 |

Primary Examiner—Paul R. Michl
Assistant Examiner—Cynthia Hamilton
Attorney, Agent, or Firm—William J. Davis

[57] ABSTRACT

A flexible and nonbrittle negative-working photoresist composition comprises a polymeric binder, a photoinitiator composition, and a polymerizable cyclohexyleneoxyalkyl acrylate monomer characterized by the structural formula:

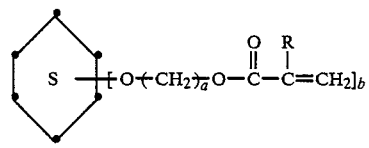

wherein
R is H or $CH_3$,
a is an integer of from 1 to 10 and
b is 1 or 2.

4 Claims, No Drawings

PHOTORESIST COMPOSITION COMPRISING CYCLOHEXYLENEOXYALKYL ACRYLATES

CROSS REFERENCE TO RELATED APPLICATIONS

Reference is hereby made to commonly-assigned U.S. patent applications Ser. No. 77,712, now U.S. Pat. No. 4,767,883, entitled POLYMERIZABLE CYCLOHEXYLENEOXYALKYL ACRYLATES filed in the name of M. F. Molaire, concurrently herewith, and Ser. No. 77,714, now U.S. Pat. No. 4,792,517, entitled LAMINATE FOR THE FORMATION OF BEAM LEADS FOR IC CHIP BONDING filed in the names of G. W. Klein, R. C. McConkey, M. F. Molaire and J. M. Noonan concurrently herewith.

BACKGROUND OF THE INVENTION

1. Field of the Invention

This invention relates to polymerizable compositions, and more particularly to negative-working photoresist compositions.

2. Description of the Prior Art

Specialized uses of polymerizable compositions such as photoresists often require a unique combination of properties. In some applications, it is desirable that the polymerized resist be flexible and nonbrittle, adhere well to a support, and have high temperature resistance and good dimensional integrity. Further, it often is desirable that the polymerizable resist composition have a low viscosity, for example, when such composition is to be coated onto a support at a high speed. Considerable difficulties have been encountered in developing a resist composition that has all of these properties.

Photopolymerizable compositions comprising benzoyloxyalkyl acrylates are described in U.S. Pat. No. 4,322,490. U.S. Pat. No. 3,832,176 discloses a photoresist layer formed of a photopolymerizable composition comprised of a bisacryloyl monomer, such as 1,4-bis(-methacryloyloxymethyl)cyclohexane. Such polymerizable compositions, however, tend to have a high viscosity and provide polymerized compositions having reduced flexibility compared to the compositions of this invention.

SUMMARY OF THE INVENTION

In accordance with the present invention there is provided a photoresist composition, comprising a polymeric binder, a photoinitiator composition, and a polymerizable monomer, which is useful as a flexible and nonbrittle negative-working photoresist.

The photoresist composition comprises a monomer characterized by the structural formula

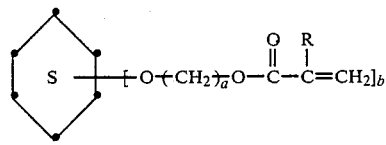

wherein
R is H or CH₃,
a is an integer of from 1 to 10 and
b is 1 or 2.

DESCRIPTION OF THE PREFERRED EMBODIMENTS

The photoresist composition of this invention includes a polymeric binder, a photoinitiator composition and a polymerizable monomer having the structural formula I set forth in the Summary above. Such composition is polymerizable and/or crosslinkable with heat or radiant energy such as UV light.

Monomers having structural formula I above are described in copending U.S. patent application Serial No. 77,712 entitled POLYMERIZABLE CYCLOHEXYLENEOXYALKYL ACRYLATES noted above. Preferred examples of such monomers include 1,4-cyclohexylenebis(oxyethyl) diacrylate, 1,4-cyclohexylenebis(oxyethyl) dimethacrylate, 1,4-cyclohexylenebis(oxypropyl) diacrylate, 1,4-cyclohexylenebis(oxypropyl) dimethacrylate, cyclohexyleneoxyethyl acrylate, and cyclohexyleneoxyethyl methacrylate. Such monomers can be prepared by reacting acryloyl chloride or methacryloyl chloride with an hydroxyalkoxycyclohexane, which itself can be prepared by hydrogenating an hydroxyalkoxy benzene. Further details of the preparation of such monomers are set forth in U.S. patent application Serial No. 77,712 entitled POLYMERIZABLE CYCLOHEXYLENEOXYALKYL ACRYLATES.

Any polymeric binder is useful with the polymerizable monomer provided that it is compatible. By compatible it is meant that the binder provides the desired rheology or film properties for the resist composition and coating. The coated film preferably is free of phase separation. Useful binders include polyacrylates, polyamides, polycarbonates, polyesters, and polyesteramides. Such binders are known to achieve desirable properties in photoresists.

Preferred polymeric binders include those having a high temperature resistance, including those described in U.S. Pat. No. 4,322,490. Highly preferred for use herein are the binders described in U.S. patent application Serial No. 77,714 entitled LAMINATE FOR THE FORMATION OF BEAM LEADS FOR IC CHIP BONDING noted above.

The monomer having structural formula I set forth above can be the sole polymerizable monomer of the resist composition. However, desirable properties, i.e. reduced viscosity and improved flexibility and brittleness, can be imparted to the composition when the monomer is present even in small amounts. Thus, other monomers capable of addition polymerization, can be incorporated into the photoresist composition to achieve the properties required for the intended use.

Useful monomers include the monomers described in U.S. Pat. No. 4,322,490 and esters prepared by reacting acrylic or methacrylic acid, a polybasic acid, and a polyhydric alcohol, as illustrated by U.S. Pat. No. 4,157,261. Preferred monomers for use in combination with the monomer of this invention include benzoyloxyethyl acrylate, benzoyloxypropyl acrylate, benzoyloxyhexyl acrylate, tris(acryloyloxyethyl)-1,3,5-benzenetricarboxylate, tris(acryloxyloxypropyl)-1,3,5-benzenetricarboxylate, tris(acryloxyloxyhexyl)-1,3,5-benzenetricarboxylate, tris(acryloxyloxyethyl)-1,2,4-benzenetricarboxylate, tris(acryloyloxypropyl)-1,2,4-benzenetricarboxylate, and tris(acryloyloxyhexyl)-1,2,4-benzenetricarboxylate.

The photoresist composition of this invention includes a conventional photoinitiator composition. Any free radical generating photoinitiator system can be used which initiates polymerization of the polymerizable monomer and does not subsequently terminate the polymerization. The free-radical generating photoinitiator system can comprise one or more compounds which directly furnish free radicals when activated by radiation. It can also comprise a plurality of compounds, one of which yields free radicals after having been caused to do so by a sensitizer which is activated by the radiation.

Representative useful examples of such photoinitiators include, for example, those described in British Patent No. 1,507,704, including benzophenone, acetophenone, ethyl methyl ketone, cyclopentanone, benzil, caprone, benzoyl cyclobutanone, and dioctyl acetone, particularly when used in admixture with substituted benzophenones such as Michler's ketone.

Highly preferred as the photoinitiator is a mixture of a 3-ketocoumarin and an amine such as is described in U.S. Pat. No. 4,289,844 by Farid et al. entitled "Photopolymerizable Compositions Featuring Novel Co-initiators".

Representative amines include ethyl-p-dimethylaminobenzoate; other esters of p-dimethylaminobenzoic acid, e.g., n-butyl-p-dimethylaminobenzoate, phenethyl-p-dimethylaminobenzoate, 2-phthalimidoethyl-p-dimethylaminobenzoate, 2-methacryloylethyl-p-dimethylaminobenzoate, 1,5-pentyl di-(p-dimethylamino)benzoate; 4,4'-bis(dimethylamino)benzophenone; phenethyl and 1,5-pentyl esters of m-dimethylaminobenzoic acid; p-dimethylaminobenzaldehyde; 2-chloro-4-dimethylaminobenzaldehyde; p-dimethylaminoacetophenone; p-dimethylaminobenzyl alcohol; ethyl-(p-dimethylamino)-benzoyl acetate; p-N-piperidinoacetophenone; 4-dimethylamino benzoin; N,N-dimethyl-p-toluidine; N,N-diethyl-m-phenetidine; tribenzyl amine; dibenzylphenyl amine; N-methyl-N-phenylbenzylamine; p-bromo-N,N-dimethylaniline; tridodecylamine; 4,4',4"-methylidyne(N,N-dimethylaniline) (crystal violet, leuco base); 3-indoleacetic acid; and N-phenylglycine.

The coumarin associated with the amine can be one or more of, e.g., the following: 3-(2-benzofuroyl)-7-diethylaminocoumarin; 3-(2-benzofuroyl)-7-(1-pyrrolidinyl)coumarin; 7-dimethylamino-3-thenoylcoumarin; 3-benzoyl-7-diethylaminocoumarin; 3-(o-methoxybenzoyl)-diethylaminocoumarin; 3-(m-fluorosulfonyl)-benzoyl-diethylaminocoumarin; 3-(p-dimethylaminobenzoyl)-diethylaminocoumarin; 3,3'-carbonylbis(5,7-di-n-propoxy coumarin); 3,3'-carbonylbis(7-diethylamino coumarin); 3-benzoyl-7-methoxycoumarin; 3-(2-furoyl)-7-diethylaminocoumarin; 3-(p-dimethylaminobenzoyl)-7-diethylaminocoumarin; 3-(p-diethylaminostyrylcarbonyl)-diethylaminocoumarin; 3-(p-morpholinostyrylcarbonyl)-diethylaminocoumarin; 9-(7-diethylamino-3-coumarinoyl)-1,2,4,5-tetrahydro-3H, 6H, 10H[1]benzopyrano[9,9a,1-gh]quinolazine-10-one, and 9-(7-n-propylamino-3-coumarinoyl)-2,4,5-tetrahydro 3H, 6H, 10H[1]benzopyrano[9, 9a, 1-gh]quinolazine-10-one.

The photoinitiator composition can be present in an amount from 0.05 to about 10 weight percent, and preferably from 0.10 to 5 weight percent.

The photoresist composition of this invention can optionally include a variety of conventional addenda, examples of which are readily obtainable from the literature. For example, a filler can be selected to provide one or more of a variety of desirable properties to the resist composition, such as lower cost, minimal shrinkage during cure, improved flatness, improved thermal conductivity, decreased tackiness, higher modulus, and/or the desired dielectric constant. Preferred fillers include silica dioxide, glass beads (solid and hollow), alumina, aluminum nitride, and aluminum borosilicate. The filler must not adversely effect the coatability of the resist and accordingly, is present in particles which are less than about 100 microns, preferably less than about 10 microns in size. The filler can be present in an amount up to 80 weight percent based on the total weight of the solvent free resist. The optimum filler loading depends of course on the particular filler selected and application, and is readily determined by one skilled in the art.

Photoinhibitors are often desirable for use in the resist composition. Useful examples of photoinhibitors include hydroquinone, 3-5-butyl-4-hydroxy-5-methylphenyl sulfide, t-butylpyrocatechol and thiobis-4,4'-(2-tert-butyl-6-methylphenol).

The composition of the invention can be applied as a coating on a support to form a photoresist element, at a dry thickness of from about 1 to about 250 microns. To apply the composition as a coating, various conventional techniques are useful. These include techniques such as spray coating, spin-coating, bead-coating, roll-coating, curtain-coating, and the like.

If a support for the composition is desired, it can be selected from a variety of known materials, including photographic supports. Useful supports include polymeric films, wood fiber, e.g. papers, metallic sheets and foils, glass, silicon wafers and ceramic elements. Such supports can be provided with one or more subbing layers to enhance the adhesive, antistatic, dimensional, abrasive, hardness, frictional, and/or other properties of the support surface which might be desired.

Useful polymeric film supports include films of cellulose nitrate and cellulose esters such as cellulose acetate, cellulose diacetate, cellulose triacetate, polystyrene, polyamides, poly(vinyl chlorides), poly(vinyl acetals), polycarbonates, polyolefins, such as polyethylene and polypropylene, poly(ethylene terephthalate), and polyesters of dibasic aromatic carboxylic acids and divalent alcohols.

A suitable solvent can be selected for preparing the composition to be coated on the support. Examples of useful solvents include dichloromethane, acetone, benzene, acetates, alcohols, ethers, toluene, 1,1,1-trichloroethane, ethyl 3-ethoxy propionate, ethyl 3-methoxy propionate, 1-methoxy-2-propyl propionate, 1-methoxy-3-propyl acetate, 1-ethoxy-2-propyl acetate, 2-ethoxyethyl acetate, 2-methoxyethanol, 2-ethoxyethanol, propylene glycol monomethyl ether acetate, 2-methoxyethylacetate, and the like.

The resist compositions of this invention can be developed in selected conventional resist developers, such as aqueous bases, buffered aqueous bases, 1,1,1-trichloroethane, dichloromethane, acetone, benzene, alcohols, ethers, toluene, KMPR 809 developer available from KTI Chemicals Inc., and the like. The preferred developer selected depends of course on the particular resist composition to be developed.

The following example further illustrates the invention.

EXAMPLE 1

The following negative-resist formulation of Table I was coated onto strips of copper and air dried to a thickness of about 50 microns. The coatings were exposed with a Colight M-218 exposing unit (mercury lamp) using a Kodak T-14 (0.15) neutral density step tablet for 30, 60 and 120 seconds.

TABLE I

| | Wt. % |
|---|---|
| Polymeric Binder | 53 |
| Monomers | 22.5 |
| | 22.5 |
| Photoinitiator Composition | |
| Ethyl-p-dimethylaminobenzoate | 1.5 |
| 3-(4-cyanobenzoyl)-5,7-dipropoxycoumarin | 0.196 |

The coatings were developed by spraying with 1,1,1-trichloroethane for 2 minutes. The 30 second exposure had no steps left on the scale. The 60 second exposure had 1½ steps with a toe to 3½ steps, the 120 second exposure had 3½ steps with a toe to 4 steps, indicating that the resist composition exhibited good speed. The developed resist was flexible and nonbrittle and adhered well to the copper support.

This invention has been described in detail with particular reference to certain preferred embodiments thereof, but it will be understood that variations and modifications can be effected within the spirit and scope of the invention.

What is claimed is:
1. A photoresist composition comprising
a polymeric binder,
a photoinitiator composition,
and a polymerizable monomer characterized by the structural formula

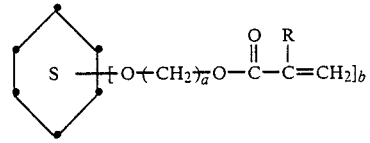

wherein R is H or $CH_3$,
a is an integer of from 1 to 10 and
b is 1 or 2.

2. The composition of claim 1 wherein said binder is selected from the group consisting of polyacrylates, polyamides, polycarbonates, polyesters, and polyesteramides.

3. The composition of claim 1 wherein said photoinitiator composition comprises a mixture of an amine and a 3-ketocoumarin.

4. The composition of claim 1 wherein said polymerizable monomer comprises 1,4-cyclohexylenebis(oxyethyl) diacrylate.

* * * * *